US008102720B2

(12) United States Patent
Rao et al.

(10) Patent No.: US 8,102,720 B2
(45) Date of Patent: Jan. 24, 2012

(54) SYSTEM AND METHOD OF PULSE GENERATION

(75) Inventors: Hari Rao, San Diego, CA (US); Anosh B. Davierwalla, San Diego, CA (US); Dongkyu Park, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 545 days.

(21) Appl. No.: 12/364,127

(22) Filed: Feb. 2, 2009

(65) Prior Publication Data

US 2010/0195379 A1 Aug. 5, 2010

(51) Int. Cl.
*G11C 16/04* (2006.01)

(52) U.S. Cl. .............. 365/189.04; 365/194; 365/189.05; 365/189.09

(58) Field of Classification Search ............. 365/189.04, 365/194, 189.05, 189.09
See application file for complete search history.

(56) References Cited

U.S. PATENT DOCUMENTS

| | | | |
|---|---|---|---|
| 4,165,490 A | 8/1979 | Howe, Jr. et al. | |
| 5,323,438 A | 6/1994 | Kim | |
| 5,404,054 A | 4/1995 | Kotowski | |
| 5,517,462 A * | 5/1996 | Iwamoto et al. | ............. 365/195 |
| 5,870,333 A | 2/1999 | Matsumoto | |
| 5,886,946 A * | 3/1999 | Ooishi | ........................ 365/233.1 |
| 5,914,622 A | 6/1999 | Inoue | |
| 5,994,937 A | 11/1999 | Hara et al. | |
| 6,020,775 A | 2/2000 | Chevallier | |
| 6,525,578 B2 * | 2/2003 | Ooishi | .......................... 327/156 |
| 6,567,312 B1 | 5/2003 | Torii et al. | |
| 6,625,057 B2 | 9/2003 | Iwata | |
| 6,711,052 B2 | 3/2004 | Subramanian et al. | |
| 6,714,440 B2 | 3/2004 | Subramanian et al. | |
| 6,920,570 B2 * | 7/2005 | Fujimoto et al. | .............. 713/300 |
| 7,113,014 B1 | 9/2006 | Doyle | |
| 2003/0230733 A1 | 12/2003 | Tanaka | |
| 2005/0117426 A1 | 6/2005 | Theel | |
| 2006/0092692 A1 | 5/2006 | Iwata et al. | |
| 2007/0139081 A1 | 6/2007 | Lee et al. | |
| 2007/0200949 A1 | 8/2007 | Walker et al. | |

(Continued)

OTHER PUBLICATIONS

International Search Report and Written Opinion—PCT/US10/022875, International Search Authority—European Patent Office, May 12, 2010.

(Continued)

*Primary Examiner* — Tuan T. Nguyen
(74) *Attorney, Agent, or Firm* — Sam Talpalatsky; Nicolas J. Pauley; Jonathan T. Velasco

(57) ABSTRACT

In a particular embodiment, a device includes a reference voltage circuit to generate a controlled voltage. The device includes a frequency circuit configured to generate a frequency output signal having a pre-set frequency and a counter to generate a count signal based on the pre-set frequency. The device also includes a delay circuit coupled to receive the count signal and to produce a delayed digital output signal and a latch to generate a pulse. The pulse has a first edge responsive to a write command and a trailing edge formed in response to the delayed digital output signal. In a particular embodiment, the pulse width of the pulse corresponds to an applied current level that exceeds a critical current to enable data to be written to an element of the memory but does not exceed a predetermined threshold.

31 Claims, 11 Drawing Sheets

U.S. PATENT DOCUMENTS

| | | | |
|---|---|---|---|
| 2009/0238006 A1* | 9/2009 | Nobunaga | 365/185.19 |
| 2010/0054041 A1* | 3/2010 | Nobunaga | 365/185.19 |
| 2010/0128524 A1* | 5/2010 | Hadas et al. | 365/185.03 |

OTHER PUBLICATIONS

Klara, "Single-Shot Circuit Implemented in Large-Scale Integration" IBM Technical Disclosure Bulletin, IBM Corp. Thornwood, US, vol. 20, No. 4, Sep. 1, 1977, p. 1458, XP002074613, ISSN: 0018-8689, the whole document.

Klara W S: "Single-Shot Circuit Implemented in Large-Scale Integration" IBM Technical Disclosure Bulletin, International Business Machines Corp. (TH0RNW00D), US, vol. 20, No. 4, Sep. 1, 1977, p. 1458, XP002074613, ISSN: 0018-8689.

International Search Report—PCT/US2010/022875, International Search Authority—European Patent Office May 12, 2010.

Written Opinion—PCT/ US2010/022875, International Search Authority—European Patent Office May 12, 2010.

* cited by examiner

SYSTEM AND METHOD OF PULSE GENERATION

I. FIELD

The present disclosure is generally related to a system and method of write pulse generation.

II. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. Portable wireless telephones, such as cellular telephones and IP telephones not only communicate voice and data packets over wireless networks, but also may incorporate other types of devices therein. For example, a wireless telephone may also incorporate a digital still camera, a digital video camera, a digital recorder, and an audio file player. Also, such wireless telephones can process executable instructions of software applications, such as a web browser application to access the Internet. However, for the benefits a user may enjoy from the other devices and software applications supported by a wireless telephone or other portable computing device, the power consumed in using the other devices and applications can quickly deplete a battery and diminish a user's experience.

One way to reduce power consumption to use non-volatile random access memory (NVRAM) for at least a portion of the memory of the personal computing device. Many portable computing devices with NVRAM devices use timing signals that require accurate pulse widths. Unfortunately, as portable computing devices are made to operate at higher operating speeds, the higher operating speeds result in narrower pulse widths. As pulse widths narrow, the task of maintaining an accurate pulse width becomes more difficult. This is especially true where temperature, voltage, and process variations affect the pulse width of signals sent to the NVRAM devices, as may occur in a portable computing device.

III. SUMMARY

In a particular embodiment, an apparatus includes a semiconductor device comprising a reference voltage circuit to generate a controlled voltage. The semiconductor device includes a fine control circuit configured to generate a frequency output signal having a pre-set frequency and a counter to generate a count signal based on the pre-set frequency. The semiconductor device also includes a delay circuit coupled to receive the count signal and to produce a delayed digital output signal and a latch to generate a pulse. The pulse has a first edge responsive to a write command and a trailing edge formed in response to the delayed digital output signal.

In a particular embodiment, an apparatus includes a means for generating a controlled voltage and a means for producing a frequency output signal having a pre-set frequency from the controlled voltage. The device also includes a means for generating a count signal based on the pre-set frequency, a means for producing a delayed digital output signal from the count signal. In addition, the device includes a means for generating a pulse that has a first edge responsive to a write command and has a trailing edge formed in response to the delayed digital output signal. The pulse has a pulse width that corresponds to an applied current level that exceeds a critical current to enable data to be written to an element of a memory, but the pulse width does not exceed a pulse width threshold.

In a particular embodiment, a method of generating a write pulse includes detecting a write command to be applied to a non-volatile random access memory (NVRAM) device, determining a width of a pulse to be applied to the NVRAM device in response to the write command, adjusting the width of the pulse a first amount to generate a first adjusted pulse, adjusting a width of the first adjusted pulse a second amount to generate a second adjusted pulse, and applying the second adjusted pulse to the NVRAM device. The second amount is less than the first amount.

In a particular embodiment, a method of generating a write pulse for application to a memory includes receiving a write signal and providing a pulse signal to a word line of the memory in response to the write signal. The pulse signal includes a pulse that has a pulse width that corresponds to an applied current level that exceeds a critical current to enable data to be written to an element of the memory but the applied current level does not exceed a predetermined current threshold.

In a particular embodiment, an apparatus includes a computer readable tangible medium storing instructions executable by the computer. The instructions include instructions that are executable by the computer to detect a write command to be applied to a non-volatile random access memory (NVRAM) device and instructions that are executable by the computer to determine a width of a pulse to be applied to the NVRAM device in response to the write command. The instructions further includes instructions that are executable by the computer to adjust the width of the pulse a first amount to generate a first adjusted pulse and instructions that are executable by the computer to adjust a width of the first adjusted pulse a second amount to generate a second adjusted pulse, and apply the second adjusted pulse to the NVRAM device. The second amount is less than the first amount.

In a particular embodiment, a device includes a housing, an antenna, a transceiver coupled to the antenna to transmit and receive signals, a processor, and a pulse generator coupled to a memory. The pulse generator is configured to selectively provide a pulse signal including a pulse that has a pulse width that corresponds to an applied current level that exceeds a critical current to enable data to be written to an element of the memory. In addition, the applied current level does not exceed a predetermined current threshold. In a particular embodiment, the pulse is a write pulse that is applied to the memory to store data.

In a particular embodiment, a method of generating a write pulse for application to a memory includes receiving a write signal and providing a pulse signal to a word line of a memory in response to the write signal. The pulse signal includes a pulse having a pulse width that corresponds to an applied current level that exceeds a critical current to enable data to be written to an element of the memory but the applied current level does not correspond to a current level that exceeds a predetermined current threshold.

One particular advantage provided by the disclosed embodiments is the generation of a write pulse that corresponds to an applied current level that exceeds a critical current to enable data to be written to an element of the memory but where the applied current level does not exceed a predetermined current threshold. As a result, power is conserved.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
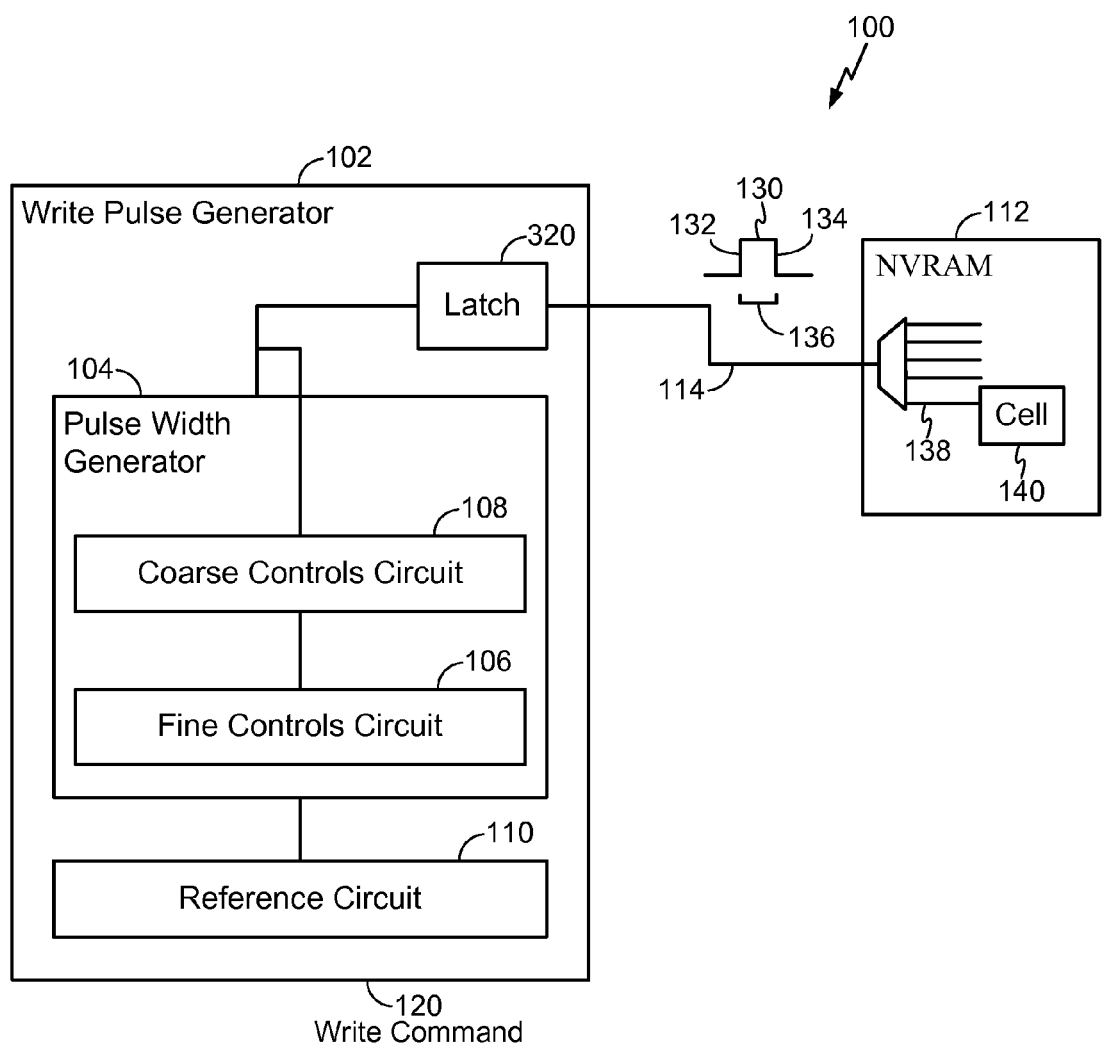
FIG. 1 is a block diagram of an illustrative embodiment of a system that includes a write pulse generator and a memory.

Referring to FIG. 1, an illustrative embodiment of a system that generates and applies a pulse signal to a memory is depicted and generally designated 100. The system 100 includes a write pulse generator device 102 coupled to a non-volatile random access memory (NVRAM) 112. In a particular illustrative example, the NVRAM 112 is flash memory, ferroelectric random access memory (FeRAM), or magnetic random access memory (MRAM). The write pulse generator device 102 generates a input 114 that is applied to the NVRAM 112. The write pulse generator device 102 includes a reference circuit 110 and a pulse width generator 104. The pulse width generator 104 includes a coarse control circuit 108 and a fine control circuit 106. The input 114 includes a write pulse 130 that has a leading edge 132, such as a leading edge generated in response to a write command 120 and a trailing edge 134, such as a trailing edge that is formed in response to a delayed digital output signal (described below with reference to FIG. 3) that is adjusted in accordance with the coarse controls circuit 108 and the fine control circuit 106. In addition, the input 114 generated by the write pulse generator device 102 is supplied based on a controlled voltage signal (described below with reference to FIG. 2) from the reference circuit 110 that is substantially independent of process, temperature, and voltage.

Figure 11:
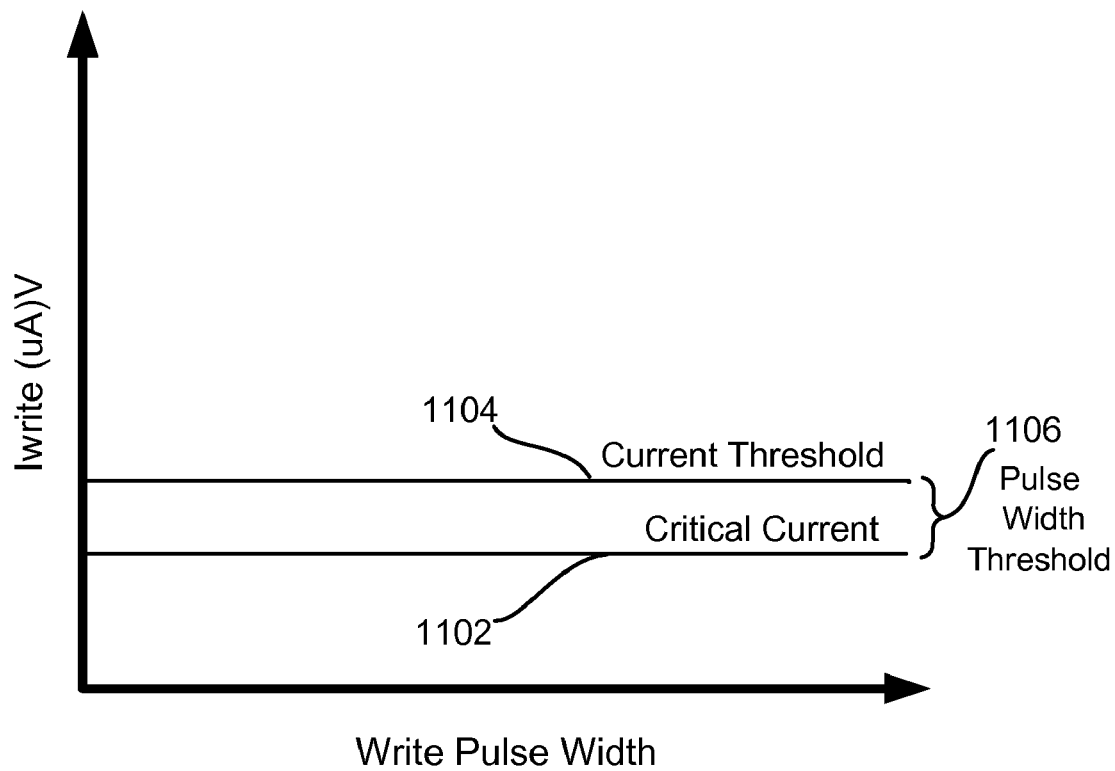
FIG. 11 is a graph illustrating the critical current and threshold current.

During operation, the write pulse generator device 102 generates the input 114 for application to the NVRAM 112. The write pulse generator device 102 receives the write command 120, such as a control signal related to a write signal request when data needs to be stored on the NVRAM 112. The write pulse generator device 102 then provides a pulse output signal, such as the input 114, to a word line 138 of the NVRAM 112 in response to the write command 120. In a particular embodiment, the input 114 includes a pulse such as the write pulse 130 that has a pulse width 136. The pulse width 136 corresponds to a current level that does not exceed a predetermined current threshold 1104 (see FIG. 11) but corresponds to an applied current level that exceeds a critical current 1102 to enable data to be written to an element of the NVRAM 112. In a particular embodiment, the predetermined current threshold 1104 is a fixed threshold based on a desired current level. For example, the predetermined current threshold 1104 may be determined based on a critical current 1102 to write a data value to a memory element of the NVRAM 112 plus an additional current associated with a pulse width resolution of a fine adjustment pulse width control circuit, such as the fine control circuit 106.

The write pulse generator device 102 provides a pulse with a precise pulse width 136 that is configured to use a small degree of extra current above the current necessary to overcome the critical current level 1102 in order to conserve energy. In addition, the generated pulse width of the pulse of the input 114 is substantially independent of external factors such as process, voltage, and temperature. In a particular embodiment, the pulse 130 included in the input 114 is a write pulse, an erase pulse, or some other pulse with a known pulse width.

Figure 2:
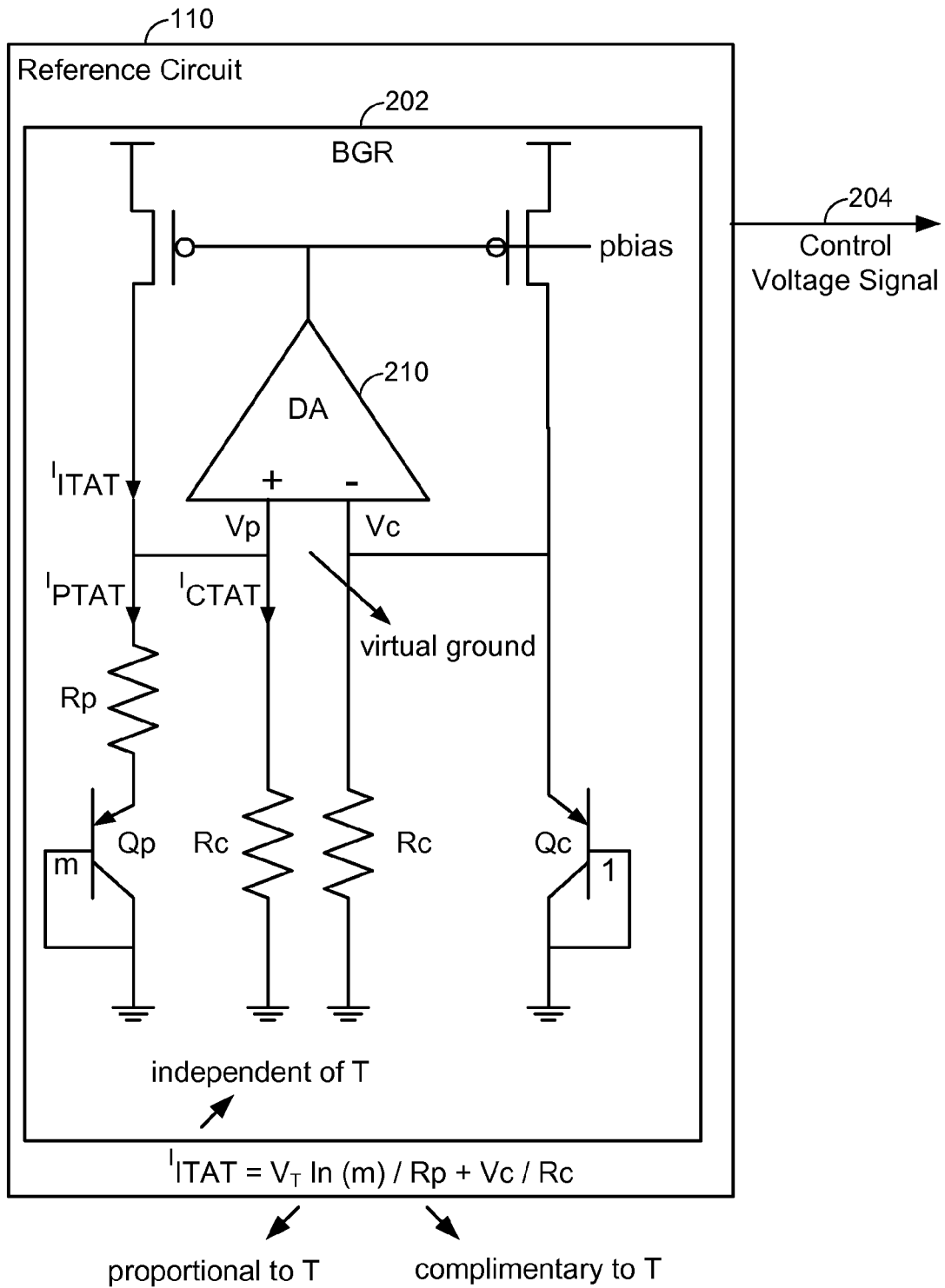
FIG. 2 is a schematic diagram of an illustrative embodiment of a device to generate a controlled voltage that is useable by the system of FIG. 1.

FIG. 2 is a schematic diagram of a particular illustrative embodiment of the reference circuit 110. The reference circuit 110 includes a band gap reference (BGR) circuit 202. The reference circuit 110 generates a controlled voltage signal 204 that is substantially independent of process, voltage, and temperature. Thus, the controlled voltage signal 204 provides a stable reference to support pulse width generation that is substantially independent of environmental factors. The reference circuit 110 includes a compensating element, such as the BGR circuit 202, to at least partially offset an effect of at least one of a process variation, a temperature variation, and a supply voltage variation on the controlled voltage, such as the controlled voltage signal 204.

Figure 3:
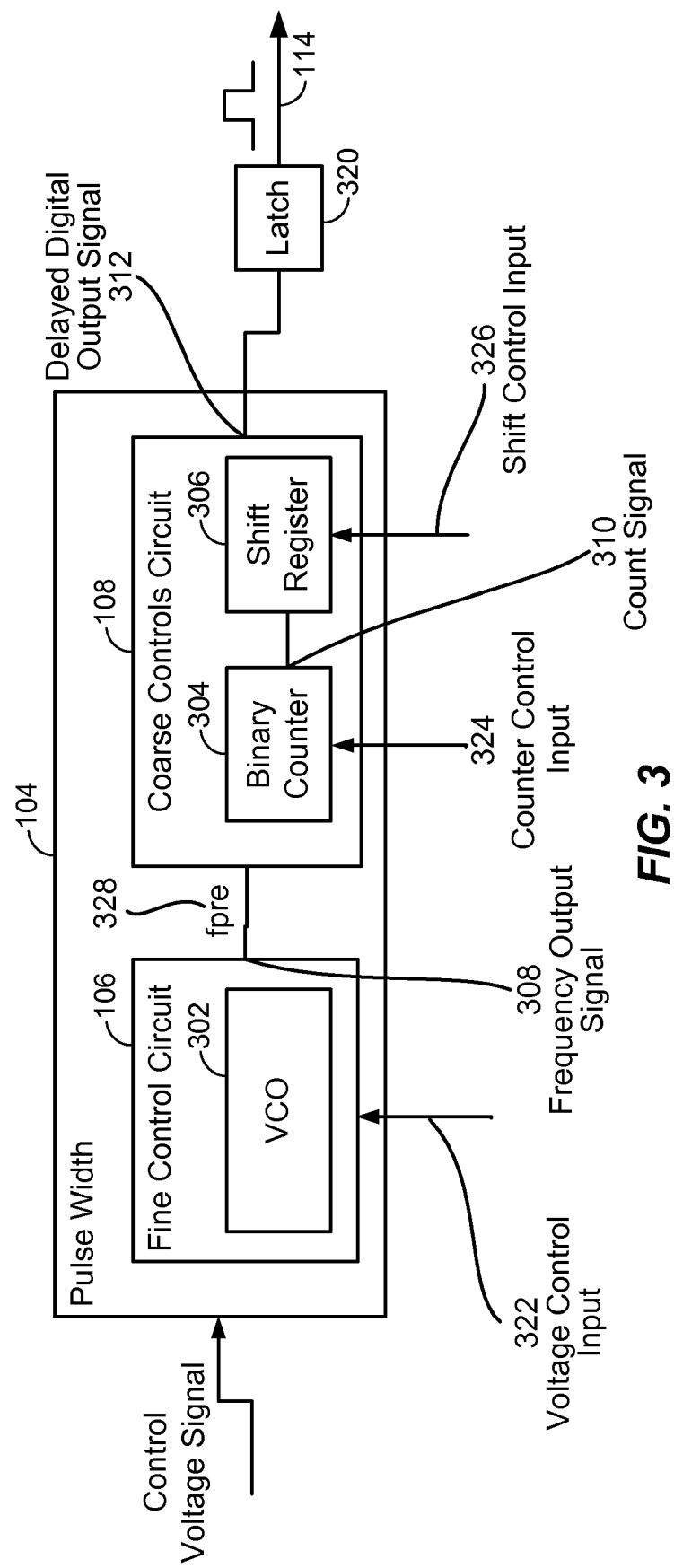
FIG. 3 is a block diagram of an illustrative embodiment of a device to generate a pulse having a controlled pulse width.

The reference circuit 110 may be implemented to include one of a variety of available band gap references. In a typical BGR circuit, the circuit maintains an internal voltage source that has a positive temperature coefficient and another internal voltage source that has a negative temperature coefficient. By summing the two internal voltages together, the temperature dependence can be canceled or reduced and the FIG. 3 shows a particular illustrative embodiment of the pulse width generator 104 including circuitry to generate a delayed digital output signal 312. The delayed digital output signal 312 is used by a latch circuit 320 to generate the trailing edge 134 of the pulse 130 included in the input 114. The pulse width generator 104 includes the fine control circuit 106 that is configured to generate a frequency output signal 308 having a pre-set frequency 328. In a particular embodiment, the pre-set frequency 328 of the frequency output signal 308 is proportional to the controlled voltage signal 204. In another particular embodiment, the fine control circuit 106 includes a voltage control oscillator 302. In another particular embodiment, the fine control circuit 106 includes more than one voltage control oscillator 302.

The pulse width generator 104 also includes the coarse control circuit 108 that includes a binary counter 304 and a shift register 306. In a particular embodiment, the shift register 306 provides delay circuit functionality and is coupled to receive a count signal 310 from the binary counter 304 to produce the delayed digital output signal 312 at its output. In this manner, the shift register 306 may add a controlled amount of delay to determine a timing of the trailing edge 134 of the pulse 130.

The pulse width generator 104 further includes a latch circuit 320 that is coupled to receive the delayed digital output signal 312 from the shift register 306. The latch circuit 320 generates the input 114, where the leading edge 132 of the pulse 130 included in the input 114 is generated in response to the write command 120 and the trailing edge 134 of the pulse 130 is generated in response to the delayed digital output signal 312 from the shift register 306.

During operation, the counter 304 generates a count signal 310 based on the pre-set frequency 328 of the frequency output signal 308 provided by the voltage control oscillator 304. A delay circuit, such as the shift register 306, is coupled to receive the count signal 310 from the counter 304 and to produce the delayed digital output signal 312. The delayed digital output signal 312 from the shift register 306 operates at a frequency that is different from the pre-set frequency 328 of the voltage control oscillator 302.

The latch circuit 320 generates the pulse 130 included in the input 114 where the pulse 130 contains the leading edge 132 responsive to the write command 120 and the trailing edge 134 formed in response to the delay digital output signal 312 from the coarse control circuit 108. In this manner, the latch circuit 320 generates the input 114 having a variable width where the leading edge 132 is determined and generated in response to the write command, such as the write command control input 120 received at the write pulse generator device 102, and the trailing edge is generated in response to an output of the shift register 306 driven by the binary counter 304 in response to the voltage controlled oscillator 302. In a particular embodiment, the pulse width generator 104 generates multiple pulses in response to a received signal, such as the controlled voltage signal 204. The controlled voltage signal 204 is generated by the reference circuit 110 as previously described.

In a particular embodiment, the latch circuit 320 is coupled to the word line 138 of a memory, such as the NVRAM 112, and enables access to at least one cell 140 of the NVRAM 112. The pulse width 136 of the pulse 130 included in the input 114 is controlled by at least one programmable input signal. In a particular embodiment, there may be multiple programmable input signals. For example, the voltage control oscillator 302 may include a programmable voltage control input 322, the counter 304 may include a counter control input 324, and the shift register 306 may include a programmable shift control input 326. The input 114 includes the write pulse 130 having a pulse width 136 that is controlled in order to provide a sufficient duration that corresponds to a current level to write a data value to at least one cell 140 of a memory device, such as the non-volatile memory device 112. In addition, the write pulse of the input 114 is substantially independent of process, voltage, and temperature variations.

After generating the write pulse of the input 114, the latch circuit 320 resets and generates a reset signal to reset either the counter 304, the shift register 306, or both, to prepare for generation of a subsequent pulse. It should be noted that the pre-set frequency 328 generated by the voltage control oscillator 302 is proportional to the controlled voltage signal 204. In this manner, the substantially environment-independent control voltage signal 204 produces a frequency that is also substantially independent of environmental factors, such as process, voltage, and temperature. Thus, the pre-set frequency 328 generated by the voltage oscillator 302 is substantially independent of the predicted range of the process, voltage, and temperature. In addition, the write pulse 130 of the input 114 has a width that is controlled by the fine control circuit 106 and the coarse control circuit 108 in a manner to define the pulse width to be within a pre-determined width range. In a particular embodiment, the write pulse 130 of the input 114 has the pulse width 136 that corresponds to an applied current level that exceeds the critical current 1102 to enable data to be written to an element of the NVRAM 112, but does not exceed the current threshold 1104 and is within a pulse width threshold 1106. The corresponding current threshold 1104 exceeds the critical current 1102 by a relatively small degree of extra current above the current necessary to overcome a critical current level in order to conserve energy.

Figure 4:
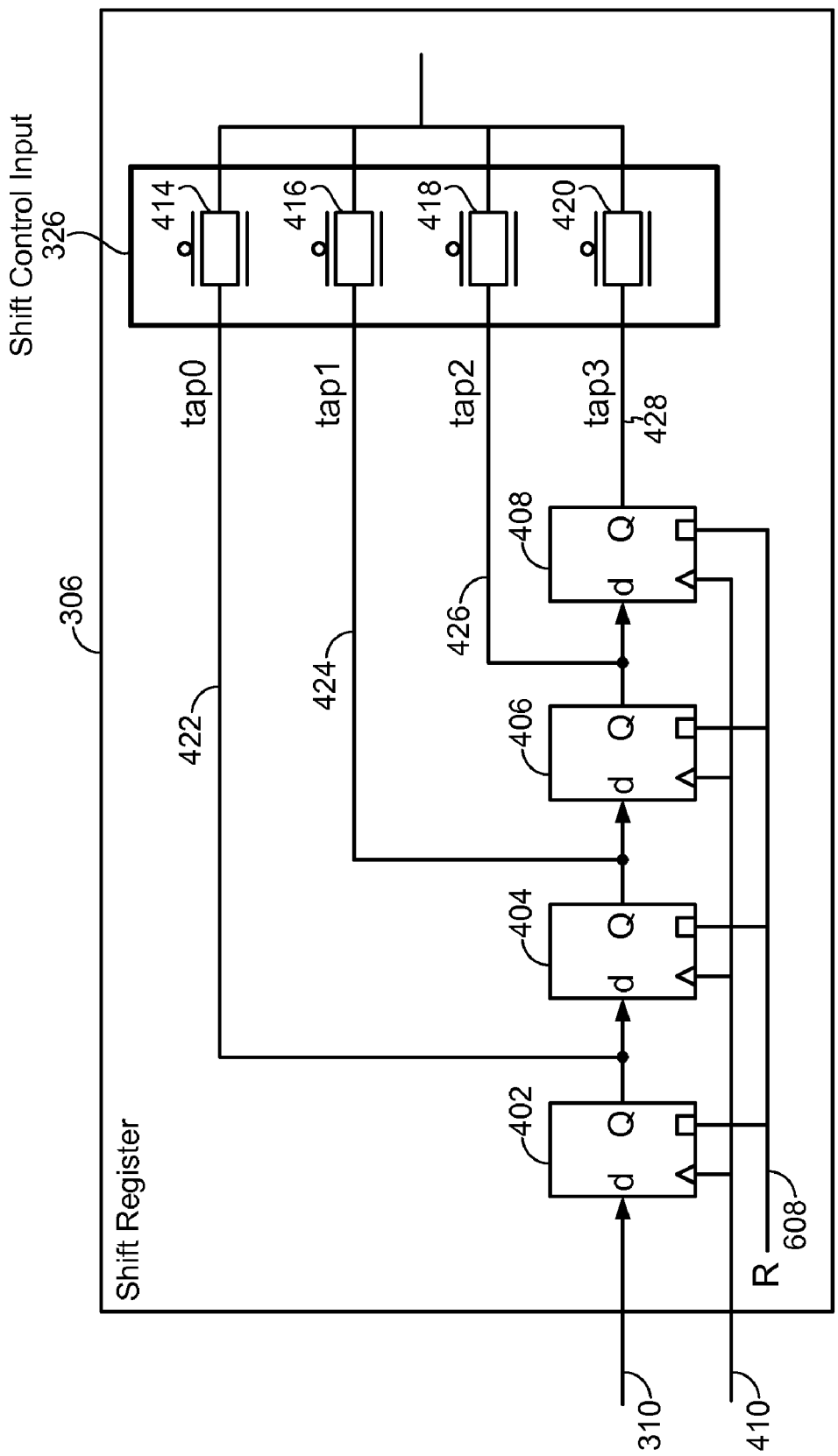
FIG. 4 is a block diagram of an illustrative embodiment of a shift register that is used to delay a trailing edge of a pulse.

FIG. 4 is a block diagram of a particular illustrative embodiment of the shift register 306. The shift register 306 includes a clock signal 410, D flip-flops 402, 404, 406, and 408, and taps 414, 416, 418, and 420. The D flip-flops 402-408 are configured to shift or delay the count signal 310 output of the counter 304 on each active transition of the clock signal 410. The taps 414-420 are configured to allow a specific shifted or delayed count signal 310 to be sent to the latch 320 as the delayed digital output signal 312.

During operation, after the shift register 306 receives the count signal 310, on the first active transition of the clock signal 410, the D flip-flop 402 sends a shift signal 422 to the tap 414. If the tap 414 is configured to allow the shift signal 422 to be sent to the latch 320, then the shift signal 422 is sent to the latch 320. However, if the tap 414 is not configured to allow the shift signal 422 to be sent to the latch 320, then the shift signal 422 is not sent to the latch 320.

On the next active transition of the clock signal 410, the D flip-flop 404 sends a shift signal 424 to the tap 416. If the tap 416 is configured to allow the shift signal 424 to be sent to the latch 320, then the shift signal 424 is sent to the latch 320. However, if the tap 416 is not configured to allow the shift signal 424 to be sent to the latch 320, then the shift signal 424 is not sent to the latch 320.

On the next active transition of the clock signal 410, the D flip-flop 406 sends a shift signal 426 to the tap 418. If the tap 418 is configured to allow the shift signal 426 to be sent to the latch 320, then the shift signal 426 is sent to the latch 320. However, if the tap 418 is not configured to allow the shift signal 426 to be sent to the latch 320, then the shift signal 426 is not sent to the latch 320.

On the next active transition of the clock signal 410, the D flip-flop 408 sends a shift signal 428 to the tap 420. If the tap 420 is configured to allow the shift signal 428 to be sent to the latch 320, then the shift signal 428 is sent to the latch 320. However, if the tap 420 is not configured to allow the shift signal 428 to be sent to the latch 320, then the shift signal 428 is not sent to the latch 320. The shift control signal 326 is used to determine which tap sends the corresponding shift signal to the latch 320.

Figure 5:
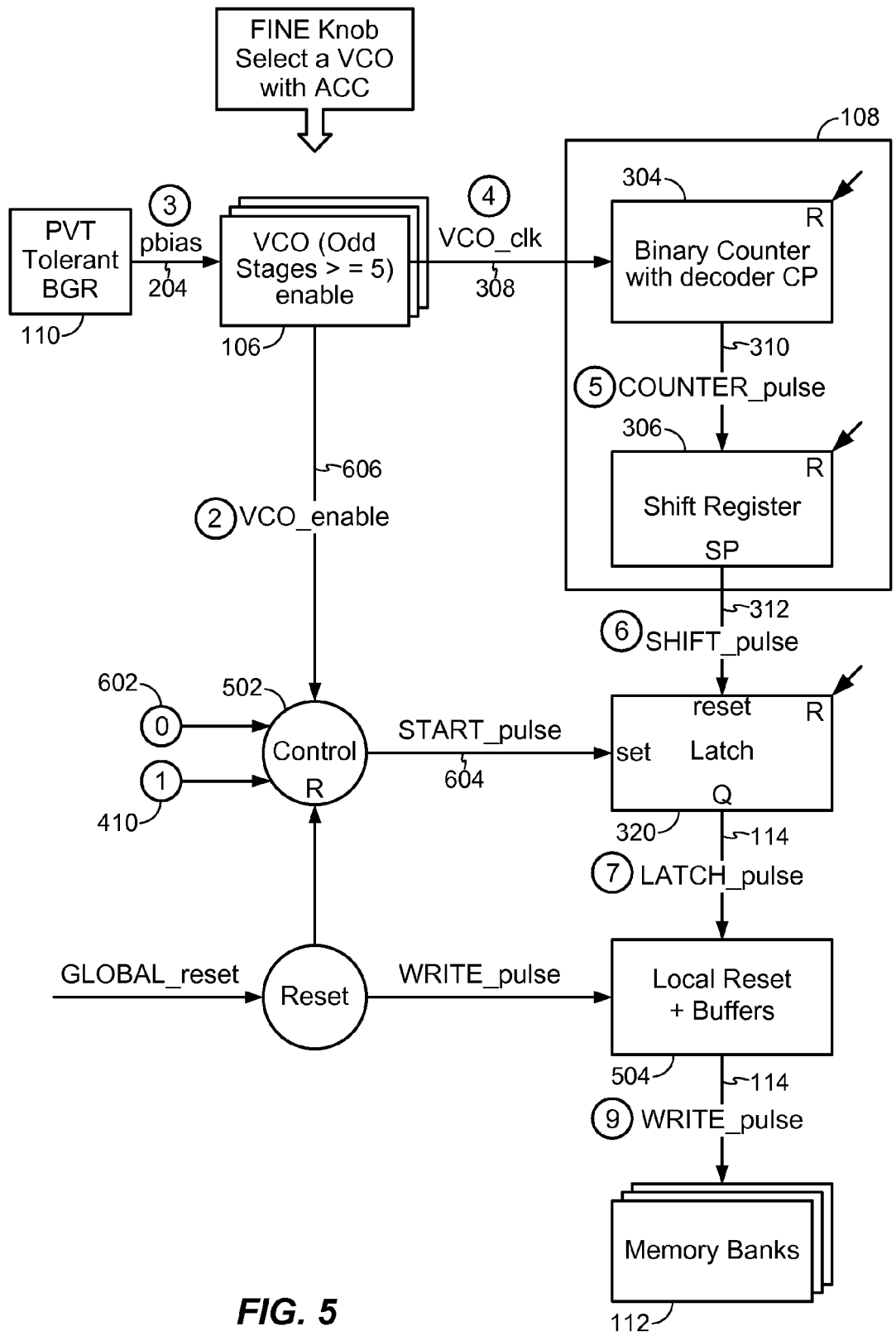
FIG. 5 is a block diagram of a second embodiment of a system that includes a write pulse generator and a memory.
Figure 6:
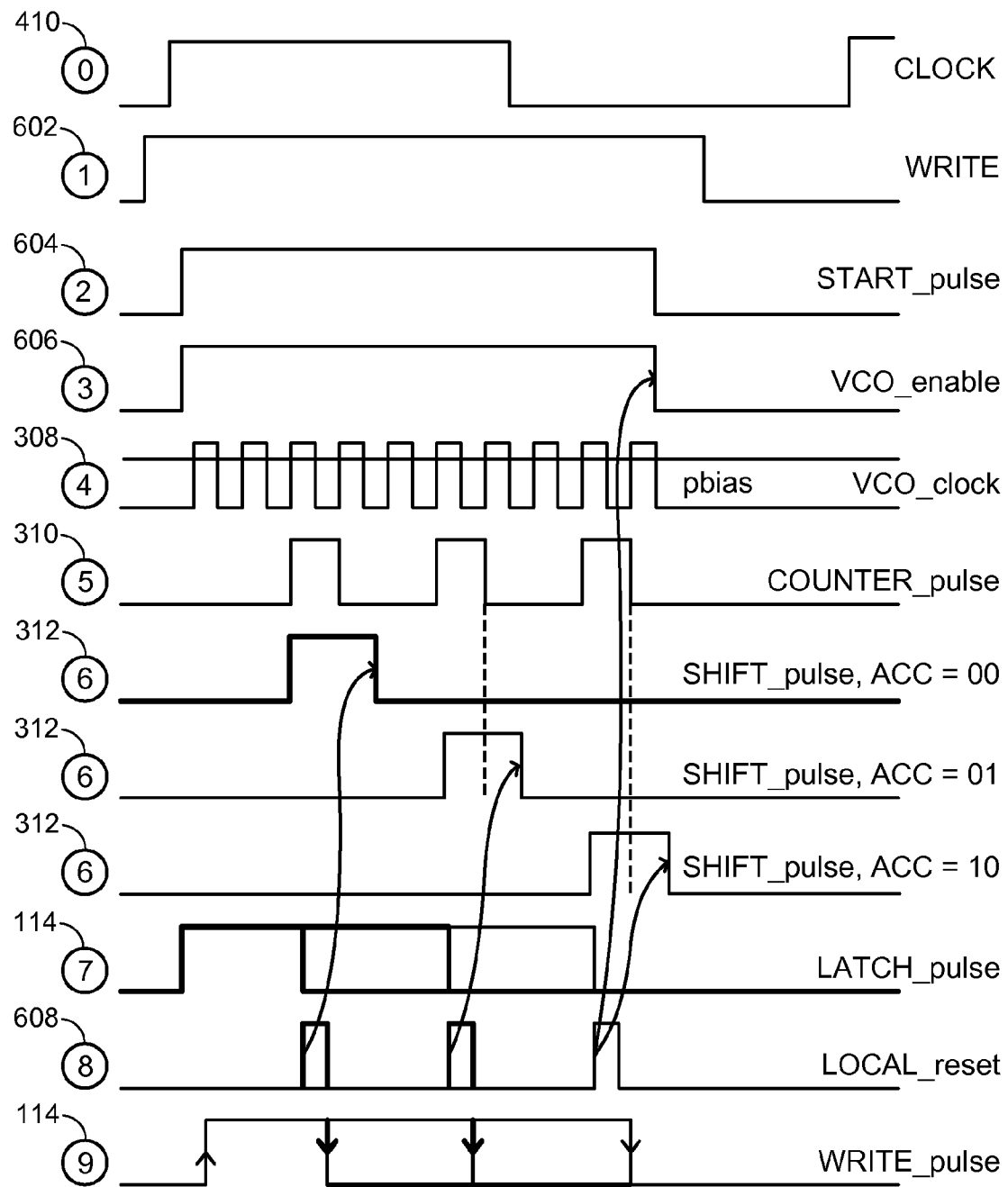
FIG. 6 is a timing diagram of an illustrative embodiment of a system to generate a pulse having a pulse width that is substantially independent of environmental conditions.

FIG. 5 is a flow diagram that illustrates operation of the devices and circuits referenced with respect to FIGS. 1-4. The method includes receiving a clock signal 410 and a write command signal 602, as shown in FIG. 6, at a control element 502. The control element 502 generates a write command signal 604, as shown in FIG. 6, that causes a latch to generate the leading edge of a pulse. Then, control element 502 generates a voltage controlled oscillator enable signal 606, as shown in FIG. 6, that is sent to the fine control circuit 106. In a particular embodiment, the fine control circuit 106 includes an odd number of VCOs 302 and each VCO 302 can be adjusted by the voltage control input 322. In addition, the reference circuit 110 generates the controlled voltage signal 204 and transmits the controlled voltage signal 204 to the fine control circuit 106. The fine control circuit 106 generates the pre-set frequency 328 in response to the controlled voltage signal 204. The signal 308 containing the pre-set frequency 328 is sent to the coarse control circuit 108.

In a particular embodiment, the binary counter 304 in the coarse control circuit 108 converts the signal 308 with the pre-set frequency 328 into the count signal 310 and transmits the count signal 310 to the shift register 306. The shift register 306 converts the count signal 310 into the delayed digital output signal 312. The latch 320 uses the delayed digital output signal 312 as a trigger to generate the trailing edge of the pulse included in the input 114. In a particular embodiment, the input 114 is sent to a local reset element 504. The local reset element 504 then transmits a reset signal 608 to reset the counter 304, the shift register 306, and the latch 320 in preparation for receiving the next controlled voltage signal 308. In addition, the local reset 504 initiates sending of the input 114 to the non-volatile memory device 112. In a particular embodiment, the trailing edge of the reset signal 608 determines the trailing edge 134 of the pulse 130 included in the input 114.

Thus, the input 114 includes a pulse that has a first edge that is responsive to the leading edge of the write signal 604 and a trailing edge that is responsive to the delayed digital output signal 312. In this manner, the width of the pulse included in the input 114 may be accurately controlled and adjusted based on a desired control and at a width that is substantially independent of process, voltage, and temperature. Thus, a robust and accurate pulse width generator is provided.

Figure 7:
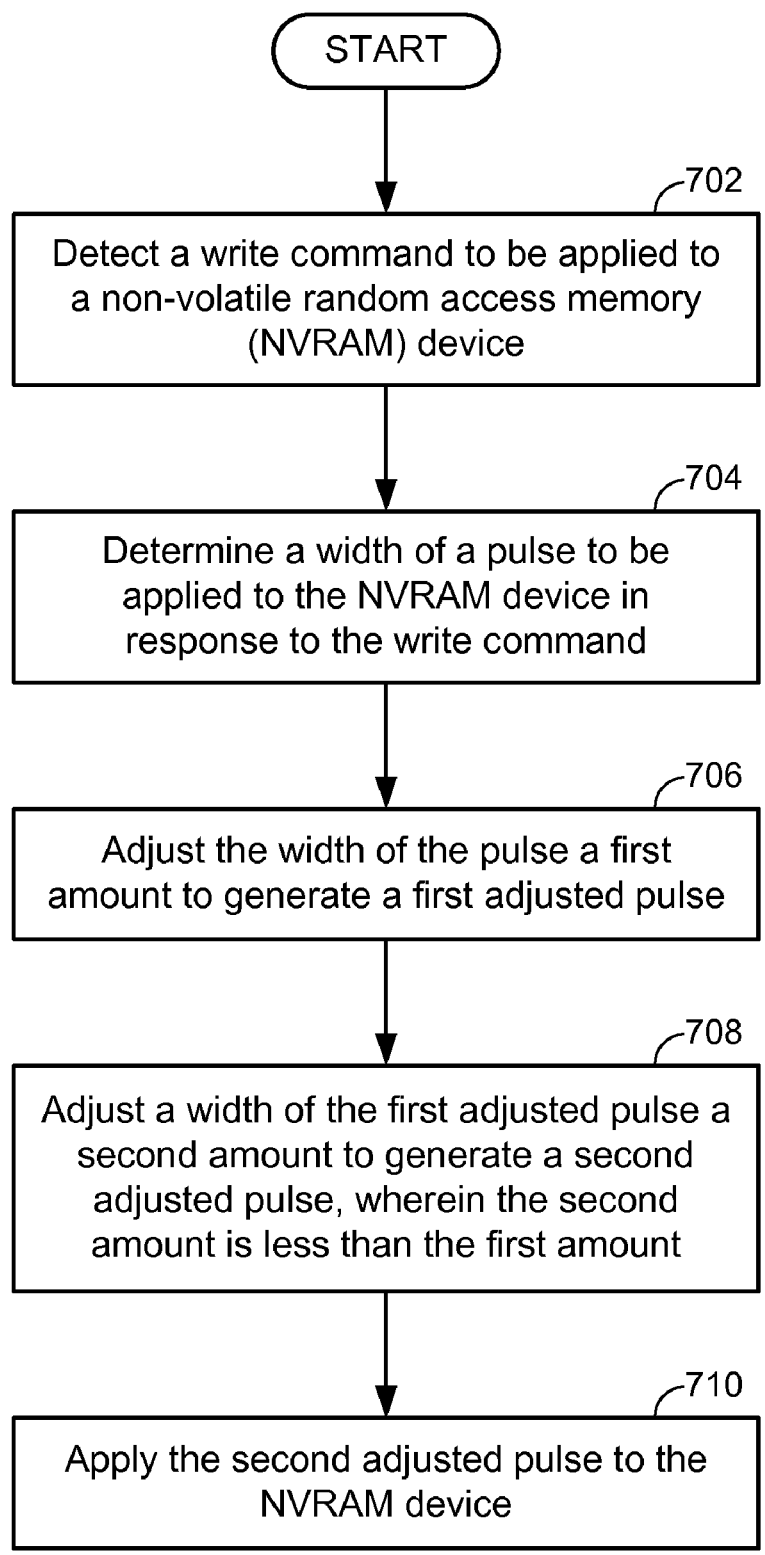
FIG. 7 is a flow chart of a particular illustrative embodiment of a method of setting a pulse width of a pulse.

FIG. 7 presents a flow chart of a particular illustrative embodiment of a method generally designated 700 of generating a write pulse. In an illustrative embodiment, the method 700 may be performed by the system 100 of FIG. 1.

A write command to be applied to a non-volatile random access memory device is detected, at 702. For example, the control element 502 may detect the write command signal 604 and the non-volatile random access memory (NVRAM) may be the non-volatile memory device 112. The width of the pulse to be applied to the NVRAM device in response to the write command is determined, at 704. For example, the width of the pulse may be determined by reviewing documentation from the maker of the NVRAM device or may be determined through experiment by incrementally increasing the pulse width until the critical current is reached thereby enabling data to be written to the NVRAM. The width of the pulse is adjusted a first amount to generate a first adjusted pulse, at 706. For example, the coarse control circuit 108 may be used to adjust the width of the pulse a first amount. The width of the first adjusted pulse is adjusted a second amount to generate a second adjusted pulse where the second amount is less than the first amount, at 708. For example, the voltage controlled oscillator 302 in the fine control circuit 106 may be used to adjust the width of the first pulse a second amount. The second adjusted pulse is applied to the NVRAM device, at 710. For example, the second adjusted pulse may be used by the latch 320 to create the trailing edge 134 of a write pulse included in the input 114 and the write pulse may be applied to the non-volatile memory device 112.

Figure 8:
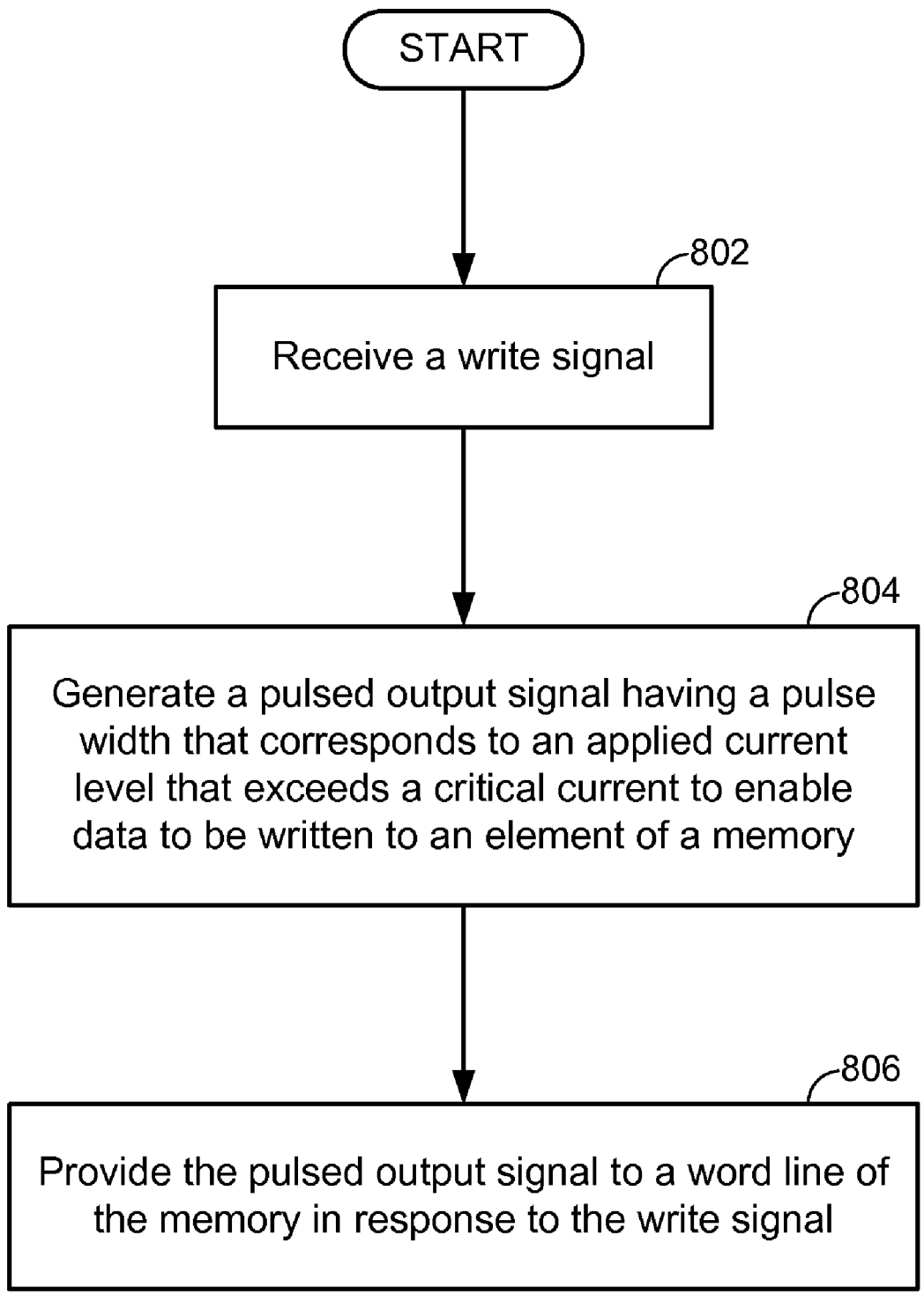
FIG. 8 is a flow chart of a second illustrative embodiment of a method of setting a pulse width of a pulse.

FIG. 8 illustrates a particular illustrative embodiment of a method generally designated 800 of generating a write pulse for application to a memory. In an illustrative embodiment, the method 800 may be performed by the system 100 of FIG. 1.

A write command signal is received, at 802. For example, the control element 502 may receive the write command signal 604. In response to the write command signal, a pulse signal is generated that includes a pulse having a pulse width that corresponds to an applied current level that exceeds a critical current to enable data to be written to an element of the memory, at 804. For example, the voltage controlled oscillator 302 in the fine control circuit 106 may be used to generate a trailing edge of the pulse 130 to define the pulse width 136 that corresponds to an applied current level that exceeds the critical current 1102 to enable data to be written to an element of the NVRAM 112 but is within the pulse width threshold 1106. The generated pulse is provided to a word line 138 of a memory, at 804. For example, in response to the write command signal 604, the latch 320 may provide the input 114 to the word line 138 of the NVRAM 112.

Figure 9:
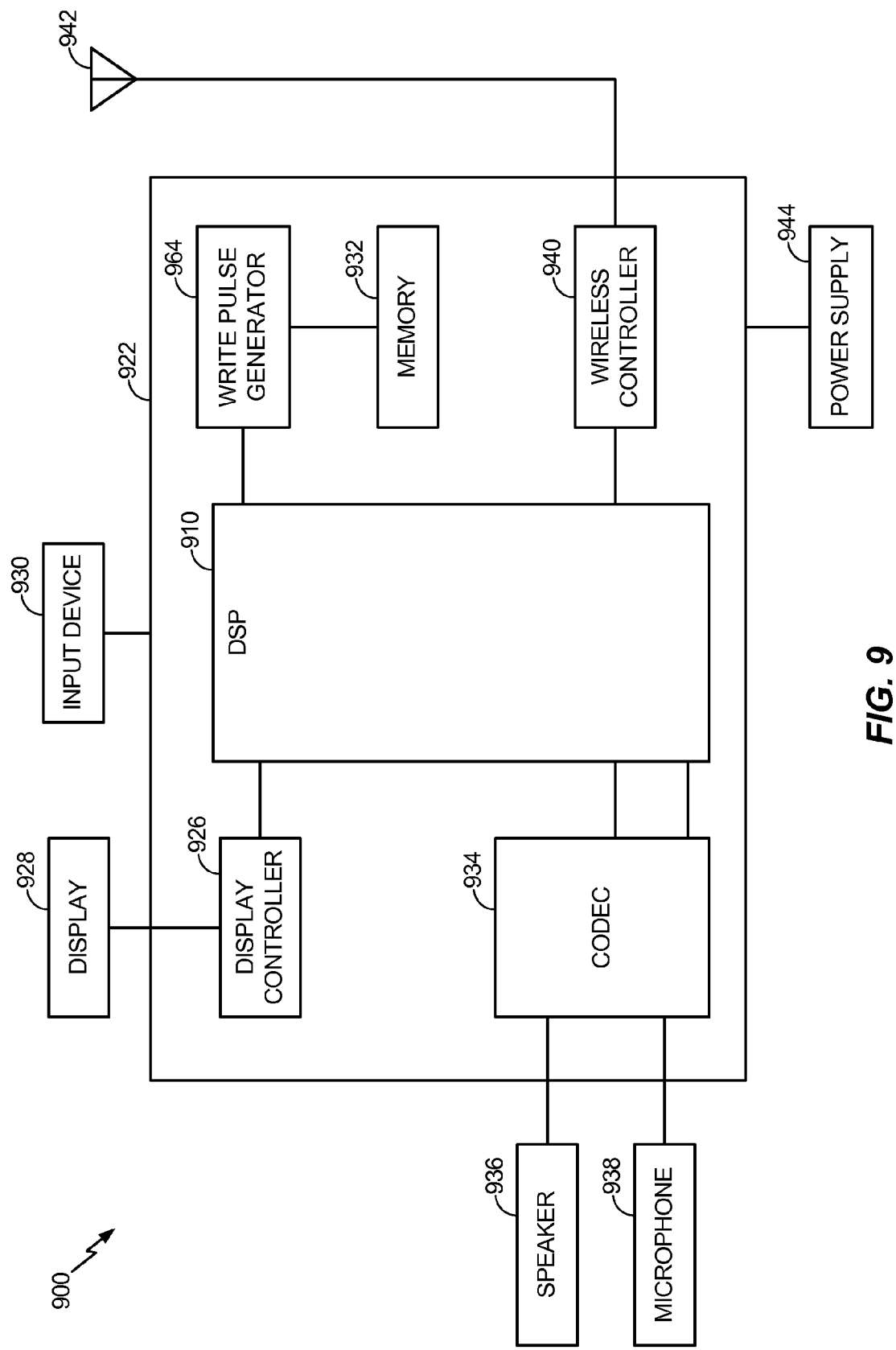
FIG. 9 is a block diagram of an illustrative communication device that includes a write pulse generator of FIG. 1.

FIG. 9 is a block diagram of an illustrative embodiment of a wireless communication device. The wireless communications device 900 includes a digital signal processor (DSP) 910 coupled to a write pulse generator 964. In a particular embodiment, the write pulse generator 964 is the system 100 of FIG. 1 and may operate in accordance with the method 700 of FIG. 7 or the method 800 of FIG. 8 or any combination thereof. Wireless device 900 may be a cellular phone, a terminal, a handset, a PDA, a wireless modem, etc.

FIG. 9 also indicates that a display controller 926 is coupled to the DSP 910 and to a display 928. Moreover, an input device 930 is coupled to the DSP 910. Additionally, a memory 932 is coupled to the write pulse generator 964. A coder/decoder (CODEC) 934 is also coupled to the DSP 910. A speaker 936 and a microphone 938 are coupled to the CODEC 934. Also, a wireless controller 940 is coupled to the DSP 910 and to a wireless antenna 942. In a particular embodiment, a power supply 944 is coupled to an on-chip system 922. In a particular embodiment, as illustrated in FIG. 9, the display 928, the input device 930, the speaker 936, the microphone 938, the wireless antenna 942, and the power supply 944 are external to the on-chip system 922. However, each is coupled to a component of the on-chip system 922.

Wireless device 900 is capable of providing bi-directional communication via a receive path and a transmit path. On the receive path, signals transmitted by base stations are received by the wireless antenna 942 and provided to the DSP 910. The DSP 910 conditions and digitizes the received signal. The wireless controller 940 performs processing for data transmission and reception, e.g., encoding, modulation, demodulation, and decoding. The display controller 926 performs processing on video content (e.g., still images, moving videos, and moving text) for video applications such as camcorder, video playback, and video conferencing and performs processing to facilitate the display of video, images, and text on the display 928. The CODEC 934 performs processing on audio content to facilitate the use of speaker 936 and microphone 938. During operation, the write pulse generator device 964 generates a pulse signal for application to the memory 932. The pulse signal is applied to a word line 138 of the memory 932 to enable data to be written to an element of the memory 932.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Figure 10:
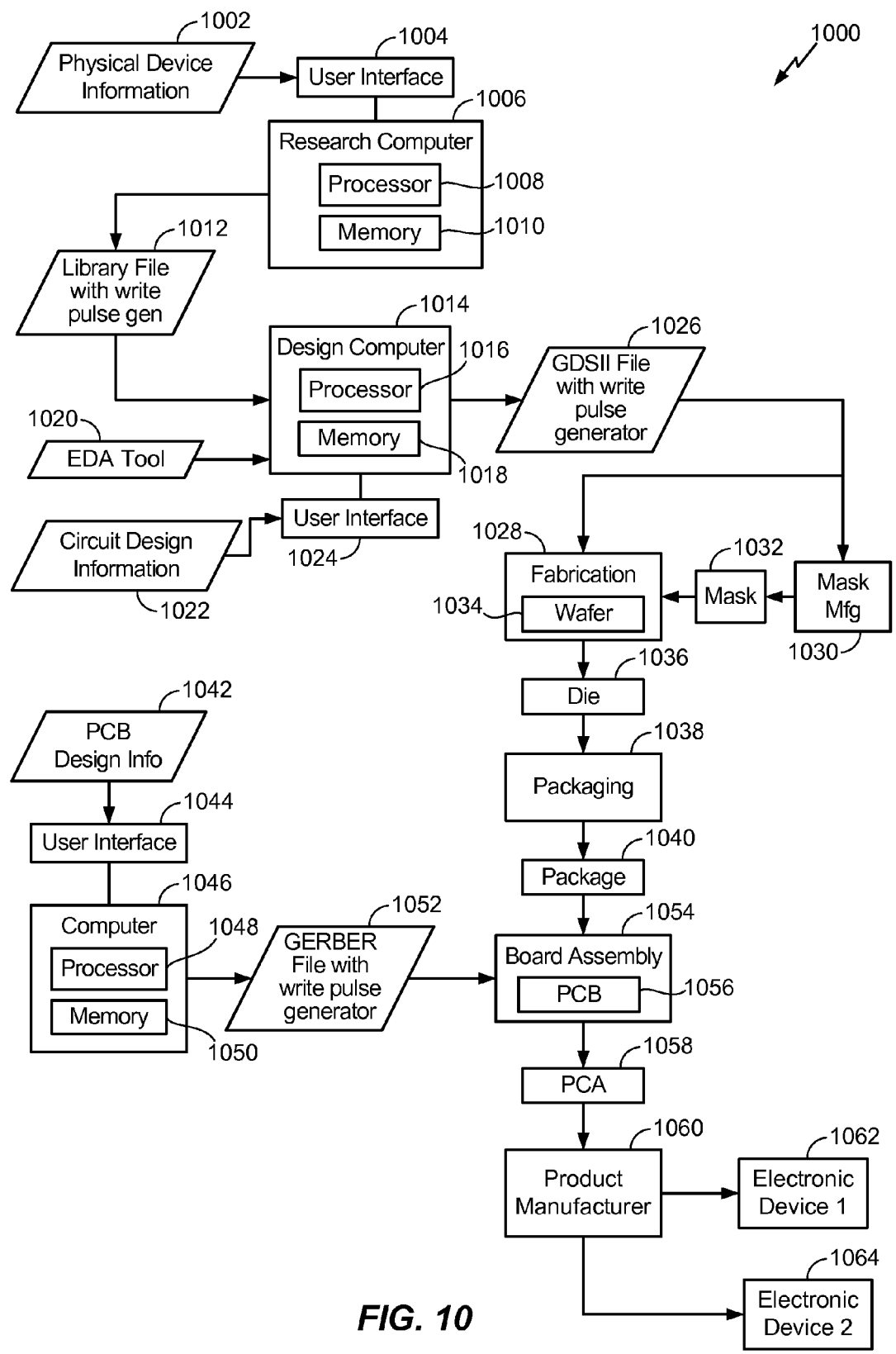
FIG. 10 is a block diagram of an illustrative embodiment of a manufacturing process that can include a write pulse generator of FIG. 1.

FIG. 10 depicts a particular illustrative embodiment of an electronic device manufacturing process 1000. Physical device information 1002 is received in the manufacturing process 1000, such as at a research computer 1006. The physical device information 1002 may include design information representing at least one physical property of a semiconductor device, such as the write pulse generator and memory of FIG. 1, the write pulse generator and memory of FIG. 5, or any combination thereof. For example the physical device information 1002 may include physical parameters, material characteristics, and structure information that is entered via a user interface 1004 coupled to the research computer 1006. The research computer 1006 includes a processor 1008, such as one or more processing cores, coupled to a computer readable medium such as a memory 1010. The memory 1010 may store computer readable instructions that are executable to cause the processor 1008 to transform the physical device information 1002 to comply with a file format and to generate a library file 1012.

In a particular embodiment, the library file 1012 includes at least one data file including the transformed design information. For example, the library file 1012 may include a library of semiconductor devices including a semiconductor device of the write pulse generator of FIG. 1, the write pulse generator including the fine control circuit 106, coarse control circuit 108, reference circuit 110, and latch 320 as depicted in FIG. 5, or any combination thereof, that is provided for use with an electronic design automation (EDA) tool 1020.

The library file 1012 may be used in conjunction with the EDA tool 1020 at a design computer 1014 including a processor 1016, such as one or more processing cores, coupled to a memory 1018. The EDA tool 1020 may be stored as processor executable instructions at the memory 1018 to enable a user of the design computer 1014 to design a circuit using the write pulse generator and memory of FIG. 1, the write pulse generator and memory of FIG. 5, or any combination thereof, of the library file 1012. For example, a user of the design computer 1014 may enter circuit design information 1022 via a user interface 1024 coupled to the design computer 1014. The circuit design information 1022 may include design information representing at least one physical property of a semiconductor device, such as a semiconductor device of the write pulse generator of FIG. 1, the write pulse generator including the fine control circuit 106, coarse control circuit 108, reference circuit 110, and latch 320 as depicted in FIG. 5, or any combination thereof. To illustrate, the circuit design property may include identification of particular circuits and relationships to other elements in a circuit design, positioning information, feature size information, interconnection information, or other information representing a physical property of a semiconductor device.

The design computer 1014 may be configured to transform the design information, including the circuit design information 1022 to comply with a file format. To illustrate, the file formation may include a database binary file format representing planar geometric shapes, text labels, and other information about a circuit layout in a hierarchical format, such as a Graphic Data System (GDSII) file format. The design computer 1014 may be configured to generate a data file including the transformed design information, such as a GDSII file 1026 that includes information describing the write pulse generator 102 of FIG. 1, a write pulse generator including the fine control circuit 106, coarse control circuit 108, reference circuit 110, and latch 320 as depicted in FIG. 5, or any combination thereof, in addition to other circuits or information. To illustrate, the data file may include information corresponding to a system-on-chip (SOC) that includes the write pulse generator of FIG. 1 and that also includes additional electronic circuits and components within the SOC.

The GDSII file 1026 may be received at a fabrication process 1028 to manufacture the write pulse generator 102 of FIG. 1, a write pulse generator including the fine control circuit 106, coarse control circuit 108, reference circuit 110, and latch 320 as depicted in FIG. 5, or any combination thereof, according to transformed information in the GDSII file 1026. For example, a device manufacture process may include providing the GDSII file 1026 to a mask manufacturer 1030 to create one or more masks, such as masks to be used for photolithography processing, illustrated as a representative mask 1032. The mask 1032 may be used during the fabrication process to generate one or more wafers 1034, which may be tested and separated into dies, such as a representative die 1036. The die 1036 includes a circuit including the write pulse generator 102 of FIG. 1, a write pulse generator including the fine control circuit 106, coarse control circuit 108, reference circuit 110, and latch 320 as depicted in FIG. 5, or any combination thereof.

The die 1036 may be provided to a packaging process 1038 where the die 1036 is incorporated into a representative package 1040. For example, the package 1040 may include the single die 1036 or multiple dies, such as a system-in-package (SiP) arrangement. The package 1040 may be configured to conform to one or more standards or specifications, such as Joint Electron Device Engineering Council (JEDEC) standards.

Information regarding the package 1040 may be distributed to various product designers, such as via a component library stored at a computer 1046. The computer 1046 may include a processor 1048, such as one or more processing cores, coupled to a memory 1050. A printed circuit board (PCB) tool may be stored as processor executable instructions at the memory 1050 to process PCB design information 1042 received from a user of the computer 1046 via a user interface 1044. The PCB design information 1042 may include physical positioning information of a packaged semiconductor device on a circuit board, the packaged semiconductor device corresponding to the package 1040 including the write pulse generator 102 of FIG. 1, a write pulse generator including the fine control circuit 106, coarse control circuit 108, reference circuit 110, and latch 320 as depicted in FIG. 5, or any combination thereof.

The computer 1046 may be configured to transform the PCB design information 1042 to generate a data file, such as a GERBER file 1052 with data that includes physical positioning information of a packaged semiconductor device on a circuit board, as well as layout of electrical connections such as traces and vias, where the packaged semiconductor device corresponds to the package 1040 including the write pulse generator 102 of FIG. 1, a write pulse generator including the fine control circuit 106, coarse control circuit 108, reference circuit 110, and latch 320 as depicted in FIG. 5, or any combination thereof. In other embodiments, the data file generated by the transformed PCB design information may have a format other than a GERBER format.

The GERBER file 1052 may be received at a board assembly process 1054 and used to create PCBs, such as a representative PCB 1056, manufactured in accordance with the design information stored within the GERBER file 1052. For example, the GERBER file 1052 may be uploaded to one or more machines for performing various steps of a PCB production process. The PCB 1056 may be populated with electronic components including the package 1040 to form a represented printed circuit assembly (PCA) 1058.

The PCA 1058 may be received at a product manufacture process 1060 and integrated into one or more electronic devices, such as a first representative electronic device 1062 and a second representative electronic device 1064. As an illustrative, non-limiting example, the first representative electronic device 1062, the second representative electronic device 1064, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 1062 and 1064 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1, 5 and 9 may illustrate remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Thus, the write pulse generator 102 of FIG. 1, a write pulse generator including the fine control circuit 106, coarse control circuit 108, reference circuit 110, and latch 320 as depicted in FIG. 5, or any combination thereof, may be fabricated, processed, and incorporated into an electronic device, as described in the illustrative process 1000. One or more aspects of the embodiments disclosed with respect to FIGS. 1, 5 and 9 may be included at various processing stages, such as within the library file 1012, the GDSII file 1026, and the GERBER file 1052, as well as stored at the memory 1010 of the research computer 1006, the memory 1018 of the design computer 1014, the memory 1050 of the computer 1046, the memory of one or more other computers or processors (not shown) used at the various stages, such as at the board assembly process 1054, and also incorporated into one or more other physical embodiments such as the mask 1032, the die 1036, the package 1040, the PCA 1058, other products such as prototype circuits or devices (not shown), or any combination thereof. Although various representative stages of production from a physical device design to a final product are depicted, in other embodiments fewer stages may be used or additional stages may be included. Similarly, the process 1000 may be performed by a single entity, or by one or more entities performing various stages of the process 1000.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory ("RAM"), flash memory, read only memory ("ROM"), programmable read only memory ("PROM"), erasable programmable read only memory ("EPROM"), electrically erasable programmable read only memory ("EEPROM"), registers, hard disk, a removable disk, a compact disc read only memory ("CD-ROM"), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit ("ASIC"). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a semiconductor device comprising:
   a reference voltage circuit to generate a controlled voltage;
   a fine control circuit configured to generate a frequency output signal having a pre-set frequency;
   a counter to generate a count signal based on the pre-set frequency;
   a delay circuit coupled to receive the count signal and to produce a delayed digital output signal; and
   a latch to generate a pulse having a first edge responsive to a write command and having a trailing edge formed in response to the delayed digital output signal.

2. The apparatus of claim 1 integrated in at least one semiconductor die.

3. The apparatus of claim 1, further comprising a device, selected from the group consisting of a set top box, music player, video player, entertainment unit, navigation device, communications device, personal digital assistant (PDA), fixed location data unit, and a computer, into which the semiconductor device is integrated.

4. The apparatus of claim 1 wherein the latch is coupled to a word line of a memory device to enable access to at least one cell of the memory device, and wherein a duration of the pulse is controlled via at least one programmable input signal.

5. The apparatus of claim 4 wherein the memory device is a non-volatile memory device and wherein the duration of the pulse is controlled to provide a sufficient duration to write a value to the at least one cell of the memory device.

6. The apparatus of claim 1, wherein the pulse has a pulse width that is substantially independent of process, voltage, and temperature variations.

7. The apparatus of claim 1, wherein the pulse is provided to a magnetic random access memory (MRAM).

8. The apparatus of claim 1, wherein the latch generates a reset signal that is used to reset at least one of the counter and the delay circuit.

9. The apparatus of claim 1, wherein the delay circuit is a shift register.

10. The apparatus of claim 1, wherein the pre-set frequency is proportional to the controlled voltage.

11. An apparatus comprising:
    means for generating a controlled voltage;
    means for producing a frequency output signal having a pre-set frequency from the controlled voltage;
    means for generating a count signal based on the pre-set frequency;
    means for producing a delayed digital output signal from the count signal; and
    means for generating a pulse having a first edge responsive to a write command and having a trailing edge formed in response to the delayed digital output signal, wherein the pulse has a pulse width that corresponds to an applied current level that exceeds a critical current to enable data to be written to an element of a memory, but the pulse width does not exceed a pulse width threshold.

12. The apparatus of claim 11 integrated in at least one semiconductor die.

13. The apparatus of claim 11, further comprising a device, selected from the group consisting of a set top box, music player, video player, entertainment unit, navigation device, communications device, personal digital assistant (PDA), fixed location data unit, and a computer, into which the means for generating the pulse is integrated.

14. The apparatus of claim 11, wherein the pulse is responsive to a coarse adjustment circuit and the delayed digital output signal is responsive to a fine adjustment circuit.

15. A method comprising:
detecting a write command to be applied to a non-volatile random access memory (NVRAM) device;
determining a width of a pulse to be applied to the NVRAM device in response to the write command;
adjusting the width of the pulse a first amount to generate a first adjusted pulse;
adjusting a width of the first adjusted pulse a second amount to generate a second adjusted pulse, wherein the second amount is less than the first amount; and
applying the second adjusted pulse to the NVRAM device.

16. The method of claim 15 wherein detecting a write command, determining a width of a pulse, adjusting the width of the pulse a first amount, adjusting a width of the first adjusted pulse a second amount, and applying the second adjusted pulse to the NVRAM device are performed at a processor integrated into an electronic device.

17. The method of claim 15 wherein the width of the second adjusted pulse to be applied to the NVRAM device in response to the write command is independent of a predicted range of process, voltage, and temperature.

18. The method of claim 15, wherein the second adjusted pulse is applied by a latch coupled to a word line of the NVRAM.

19. The method of claim 15 wherein the first adjusted pulse is responsive to a coarse pulse width adjustment circuit and the second adjusted pulse is responsive to a fine pulse width adjustment circuit.

20. The method of claim 19, wherein the coarse pulse width adjustment circuit includes a counter and a shift register.

21. The method of claim 18, further comprising receiving an input at a tap to control a delay of the shift register of the coarse pulse width adjustment circuit.

22. A method comprising:
a first step for detecting a write command to be applied to a non-volatile random access memory (NVRAM) device;
a second step for determining a width of a pulse to be applied to the NVRAM device in response to the write command;
a third step for adjusting the width of the pulse a first amount to generate a first adjusted pulse;
a fourth step for adjusting a width of the first adjusted pulse a second amount to generate a second adjusted pulse, wherein the second amount is less than the first amount; and
a fifth step for applying the second adjusted pulse to the NVRAM device.

23. The method of claim 22, wherein the first step, the second step, the third step, the fourth step, and the fifth step are performed by a processor integrated into an electronic device.

24. A computer readable tangible medium storing instructions executable by a computer, the instructions comprising:
instructions that are executable by the computer to detect a write command to be applied to a non-volatile random access memory (NVRAM) device;
instructions that are executable by the computer to determine a width of a pulse to be applied to the NVRAM device in response to the write command;
instructions that are executable by the computer to adjust the width of the pulse a first amount to generate a first adjusted pulse;
instructions that are executable by the computer to adjust a width of the first adjusted pulse a second amount to generate a second adjusted pulse, wherein the second amount is less than the first amount; and
instructions that are executable by the computer to apply the second adjusted pulse to the NVRAM device.

25. The computer readable tangible medium of claim 24, wherein the instructions are executable by a processor integrated in a device selected from the group consisting of a set top box, music player, video player, entertainment unit, navigation device, communications device, personal digital assistant (PDA), fixed location data unit, and a computer.

26. A method comprising:
receiving design information representing at least one physical property of a semiconductor device, the semiconductor device including:
a reference voltage circuit to generate a controlled voltage;
a fine control circuit configured to generate a frequency output signal having a pre-set frequency;
a counter to generate a count signal based on the pre-set frequency;
a delay circuit coupled to receive the count signal and to produce a delayed digital output signal; and
a latch to generate a pulse having a first edge responsive to a write command and having a trailing edge formed in response to the delayed digital output signal;
transforming the design information to comply with a file format; and
generating a data file including the transformed design information.

27. The method of claim 26, wherein the data file includes a GDSII format.

28. A method comprising:
receiving a data file including design information corresponding to a semiconductor device; and
fabricating the semiconductor device according to the design information, wherein the semiconductor device includes:
a reference voltage circuit to generate a controlled voltage;
a fine control circuit configured to generate a frequency output signal having a pre-set frequency;
a counter to generate a count signal based on the pre-set frequency;
a delay circuit coupled to receive the count signal and to produce a delayed digital output signal; and
a latch to generate a pulse having a first edge responsive to a write command and having a trailing edge formed in response to the delayed digital output signal.

29. The method of claim 28, wherein the data file includes a GDSII format.

30. A method comprising:
receiving design information including physical positioning information of a packaged semiconductor device on a circuit board, the packaged semiconductor device including a semiconductor structure comprising:

a reference voltage circuit to generate a controlled voltage;

a fine control circuit configured to generate a frequency output signal having a pre-set frequency;

a counter to generate a count signal based on the pre-set frequency;

a delay circuit coupled to receive the count signal and to produce a delayed digital output signal; and a latch to generate a pulse having a first edge responsive to a write command and having a trailing edge formed in response to the delayed digital output signal; and transforming the design information to generate a data file.

31. The method of claim 30, wherein the data file has a GERBER format.

* * * * *